United States Patent
Steadman Booker et al.

(10) Patent No.: US 11,740,368 B2
(45) Date of Patent: Aug. 29, 2023

(54) PHOTON COUNTING DETECTOR

(71) Applicant: KONINKLIJKE PHILIPS N.V., Eindhoven (NL)

(72) Inventors: Roger Steadman Booker, Aachen (DE); Amir Livne, Zichron Ya'Aqov (IL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 17/781,151

(22) PCT Filed: Dec. 8, 2020

(86) PCT No.: PCT/EP2020/084997
§ 371 (c)(1),
(2) Date: May 31, 2022

(87) PCT Pub. No.: WO2021/122134
PCT Pub. Date: Jun. 24, 2021

(65) Prior Publication Data
US 2022/0413170 A1    Dec. 29, 2022

(30) Foreign Application Priority Data
Dec. 17, 2019   (EP) ................................ 19216882

(51) Int. Cl.
*G01T 1/24* (2006.01)
*H01L 27/146* (2006.01)

(52) U.S. Cl.
CPC .............. *G01T 1/243* (2013.01); *G01T 1/241* (2013.01); *H01L 27/14661* (2013.01)

(58) Field of Classification Search
CPC .... G01T 1/243; G01T 1/241; H01L 27/14661
See application file for complete search history.

(56) References Cited

U.S. PATENT DOCUMENTS 9,955,930 B2 *   5/2018   Steadman Booker ... A61B 6/03
2004/0217293 A1   11/2004   Tsuchiya
(Continued)

FOREIGN PATENT DOCUMENTS

WO   WO2017093500 A1   6/2017
WO   WO2017116524 A1   7/2017

OTHER PUBLICATIONS

PCT International Search Report, International application No. PCT/EP2020/084997, dated Feb. 11, 2021.

*Primary Examiner* — Seung C Sohn
(74) *Attorney, Agent, or Firm* — Larry Liberchuk (57) ABSTRACT

The present invention relates to a photon counting detector comprising a plurality of detector tiles. Each detector tile comprises a sensor material layer (20), an integrated circuit (30), an input/output connection or flex (50), a high voltage electrode or foil (60), and an anti scatter grid (10). The input/output connection or flex is connected to the integrated circuit. The integrated circuit is configured to readout signals from the sensor material layer. The anti scatter grid is positioned adjacent to a surface of the sensor material layer. The high voltage electrode or foil extends across the surface of the sensor material layer and is configured to provide a bias voltage to the surface of the sensor material layer. The high voltage electrode or foil comprises at least one tail section (70). Relating to the photon counting detector and the plurality of detector tiles, the high voltage electrode or foil of a first detector tile is configured to make an electrical connection with the high voltage electrode or foil of an adjacent detector tile via one or more tail sections of the at least one tail section of the first detector tile and/or via one or more tail sections of the at least one tail section of the adjacent detector tile.

15 Claims, 4 Drawing Sheets

(56) References Cited

U.S. PATENT DOCUMENTS

| | | |
|---|---|---|
| 2006/0056581 A1 | 3/2006 | Hoffman |
| 2009/0114831 A1 | 5/2009 | Spartiotis |
| 2010/0327173 A1 | 12/2010 | Woychik |
| 2012/0133054 A1 | 5/2012 | Tkaczyk |
| 2013/0049151 A1 | 2/2013 | Lobastov |
| 2014/0348290 A1 | 11/2014 | Harrison |

* cited by examiner

PHOTON COUNTING DETECTOR

FIELD OF THE INVENTION

The present invention relates to photon counting detector, and a detector tile for a photon counting detector.

BACKGROUND OF THE INVENTION

Energy-resolving photon counting detectors for X-ray spectral computer tomography (CT) make use of direct converting sensor materials, e.g. CdTe, CZT, Silicon, GaAs, Ge, Perovskites. These sensor materials are semiconductor compounds which require a high voltage bias (e.g. 300V/mm) to ensure a homogeneous electric field within the bulk. As in conventional X-ray CT, spectral CT detectors will also need to be able to provide large detection areas. It has been proposed to use detectors consisting of tiles or detector modules in order to extend the detection areas. US2010/0327173A1 describes a detector module that comprises a direct conversion crystal for converting incident photons into electrical signals, the direct conversion crystal having an anode layer deposited on a first Surface and a cathode layer deposited on a second surface. The module also comprises a redistribution layer deposited on the anode layer, the redistribution layer configured to adapt a pad array layout of the direct conversion crystal to a predetermined lead pattern, and an integrated circuit in electrical communication with the direct conversion crystal. A plurality of input/output electrical paths are connected to the redistribution layer to provide connectivity between the imaging module and another level of interconnect.

US 2013/049151A1 describes interconnect structures suitable for use in connecting anode-illuminated detector modules to downstream circuitry. In certain embodiments, the interconnect structures are based on or include low atomic number or polymeric features and/or are formed at a density or thickness so as to minimize or reduce radiation attenuation by the interconnect structures.

US 2004/217293A1 describes that in a gamma camera, a plurality of radiation detector elements having a rod-shaped first electrode, a semiconductor device surrounds the first electrode to contact with it for entering a radiation, and a second electrode provided for the side surface of the semiconductor device are detachably attached to a holding member. The holding member has a first electrode contact portion contacted with the first electrode and a second electrode contact portion contacted with the second electrode. A collimator in which a plurality of radiation paths provided corresponding to the plurality of radiation detector elements are formed is arranged on the radiation entering side of the plurality of radiation detector elements. A gamma-ray detection signal outputted from the first electrode contact portion is sent to a signal processing integrated circuit. A high voltage is applied to the second electrode via the second electrode contact portion.

WO 2017/093500A1 relates to a radiation detector, in particular a direct conversion radiation detector. To provide for simple distribution of provided high voltage the radiation detector comprises a plurality of detector modules arranged adjacent to each other.

Each detector module comprises a sensor layer for converting incident radiation into electrical charges, a first electrode deposited on a first surface of the sensor layer facing the incident radiation, a second electrode deposited on a second surface of the sensor layer opposite the first surface, a readout electronics in electrical contact with the second electrode, and a carrier for carrying the sensor layer and the readout electronics. The radiation detector further comprises an electrically conductive conduction layer and an anti-scatter arrangement, which are arranged on top of each other and cover the plurality of detector modules on the side facing the incident radiation.

However, making a large area detector from such tiles or modules is extremely difficult. Contrary to the case of conventional X-ray detectors, the top side of the energy resolving photon counting detector also requires biasing, i.e. a bias voltage must be applied to every tile. For a limited coverage detector the HV (High Voltage) is brought onto the cathode by a small cable through a decoupling capacitor. For large detectors however, distributing the HV cannot be done with cables since it requires soldering (i.e. impacts serviceability) and will interfere with the impinging X-ray spectrum (from wires distributing the HV over the detection area). Routing the HV along the sides of the detector would also have a detrimental impact on the sensor performance.

There is a need to address these issues.

SUMMARY OF THE INVENTION

It would be advantageous to have improved means of providing a large area photon counting detector. The object of the present invention is solved with the subject matter of the independent claims, wherein further embodiments are incorporated in the dependent claims. It should be noted that the following described aspects and examples of the invention apply also to the photon counting detector, and the detector tile for a photon counting detector.

In a first aspect, there is provided

A photon counting detector comprising a plurality of detector tiles. Each detector tile comprises:

a sensor material layer;
an integrated circuit;
an input/output connection or flex;
a high voltage electrode or foil; and
an anti scatter grid.

The input/output connection or flex is connected to the integrated circuit. The integrated circuit is configured to readout signals from a plurality of pixels of the sensor material layer. The anti scatter grid is positioned adjacent to a surface of the sensor material layer. The high voltage electrode or foil extends across the surface of the sensor material layer and is configured to provide a bias voltage to the surface of the sensor material layer, and wherein the high voltage electrode or foil comprises at least one tail section.

For the photon counting detector, the high voltage electrode or foil of a first detector tile is configured to make an electrical connection with the high voltage electrode or foil of an adjacent detector tile via one or more tail sections of the at least one tail section of the first detector tile and/or via one or more tail sections of the at least one tail section of the adjacent detector tile.

In other words, photon counting detector is provided in a modular form enabling different sized detectors to be configured. This is achieved through each tile, or detector module, of the photon counting detector its own HV flex foil such that the HV connection between tiles is made mechanically when they are placed adjacent to each other, in a daisy-chain type of connection. Thus, the bias voltage that must be applied to each tile is propagated to each tile via the adjacent tiles. This connection can operate for a one-dimensional detector and also for a two-dimensional arrangement.

In this manner, the new photon counting detector can find utility in photon counting spectral computed tomography detection with direct conversion sensor materials, and for photon counting detectors for large coverage applications with direct conversion sensor materials.

In other words, a new technique is provided to distribute the high voltage bias for direct conversion sensors in Photon Counting CT, compatible with large coverage. This is achieved by propagating the High Voltage bias across detector Tiles such that it does not interfere with the performance of the sensor and the impinging spectrum. A daisy-chain-like interconnection is established across Tiles by means of contact pressure. This can be achieved during assembly or when a tile of the detector needs to be replaced. The technique is compatible for complete tile assemblies that incorporate their own anti scatter grids (ASG).

Thus, the new modular photon counting detector arrangement, made from individual tiles that propagate the bias voltage to adjacent tiles and where each tile has its own anti scatter grid, enables individual tiles to be replaced if necessary in a convenient manner. Also, stringent alignment requirements relating to the anti scatter grid are mitigated through each tile having its own anti scatter grid.

That the high voltage electrode or foil, first detector tile can make an electrical connection with the high voltage electrode or foil of an adjacent detector tile, utilizing one or more tail sections of the electrode or foil of the first detector tile and/or the electrode or foil of the adjacent detector tile, does not mean that the tail sections necessarily contact each other directly. For example, high voltage electrode or foil of one detector tile can make electrical contact with its ASG and the tail section of the high-voltage electrical foil of an adjacent detector tile can then contact the ASG of the first detector tile. Or, tail sections can contact one another from adjacent detector tiles, or tail sections of high-voltage electrical foils of detector tiles can contact a separate electrode or flex that itself is connected to a high voltage supply, and in this way the high-voltage electrical foils are electrically connected to one another with tail sections of those foils being used to distribute the required high voltage bias for the sensor material layer.

In an example, the high voltage electrode or foil of the first detector tile is configured to make an electrical connection with the high voltage electrode or foil of a second adjacent detector tile via one or more tail sections of the at least one tail section of the first detector tile and/or via one or more tail sections of the at least one tail section of the second adjacent detector tile.

In an example, the high voltage electrode or foil of the first detector tile is configured to make an electrical connection with the high voltage electrode or foil of a third adjacent detector tile via one or more tail sections of the at least one tail section of the first detector tile and/or via one or more tail sections of the at least one tail section of the third adjacent detector tile.

In an example, the high voltage electrode or foil of the first detector tile is configured to make an electrical connection with the high voltage electrode or foil of a fourth adjacent detector tile via one or more tail sections of the at least one tail section of the first detector tile and/or via one or more tail sections of the at least one tail section of the fourth adjacent detector tile.

In an example, one or more tail sections of the at least one tail section of the first detector tile are configured to make an electrical connection with one or more tail sections of the at least one tail section of the adjacent detector tile.

In an example, for each detector tile the anti scatter grid is not electrically connected to the high voltage electrode or foil.

In this manner, the high voltage electrodes or foils can be provided with the required bias voltage for the sensor material layer without the ASG itself then being at high potential, which can aid maintenance or re-fitting in some situations.

In an example, for each detector tile a surface of the high voltage electrode or foil facing away from the sensor material layer comprises an insulating layer.

In an example, for each detector tile the anti scatter grid is electrically connected to the high voltage electrode or foil. The anti scatter grid of the first detector tile is configured to electrically connect to the anti scatter grid of an adjacent detector tile via the one or more tail sections of the at least one tail section of the first detector tile and/or via the one or more tail sections of the at least one tail section of the adjacent detector tile.

In an example, tail sections contacting anti scatter grids of adjacent detector tiles extend in a direction away from the sensor material layers, and/or tail sections contacting tail sections of adjacent detector tiles extend in the direction away from the sensor material layers.

In an example, for each detector tile one or more of the at least one tail section are fixedly attached to one or more respective sides of the anti scatter grid.

In an example, the photon counting detector comprises at least one high voltage connection or flex, and wherein each detector tile of a plurality of detector tiles adjacent to a high voltage connection or flex of the at least one high voltage connection or flex is configured to electrically connect to the high voltage connection or flex by a tail section.

Thus, the high voltage electrode or foil of one detector tile is connected to the high voltage electrode or foil of an adjacent detector tile via a tail section of both being connected to a common high voltage flex.

There could clearly be two lines of detector tiles, either side of the common high voltage flex.

In an example, each detector tile has a high voltage electrode or foil comprising one, or two, or three or four tail sections.

Different detector tiles in the photon counting detector can have high voltage electrodes or foils having different numbers of tail sections.

In an example, each detector tile is configured to be removed from the photon counting detector.

In a second aspect, there is provided a detector tile for a photon counting detector comprising a plurality of detector tiles. The detector tile comprises:

a sensor material layer;
an integrated circuit;
an input/output connection or flex;
a high voltage electrode or foil; and
an anti scatter grid.

The input/output connection or flex is connected to the integrated circuit. The integrated circuit is configured to readout signals from a plurality of pixels of the sensor material layer. The anti scatter grid is positioned adjacent to a surface of the sensor material layer. The high voltage electrode or foil extends across the surface of the sensor material layer and is configured to provide a bias voltage to the surface of the sensor material layer, and the high voltage electrode or foil comprises at least one tail section.

In an example, when connected into the photon counting detector the high voltage electrode or foil of the detector tile is configured to make an electrical connection with a high voltage electrode or foil of an adjacent detector tile via one or more tail sections of the at least one tail section of the detector tile and/or via one or more tail sections of at least one tail section of the adjacent detector tile.

Advantageously, the benefits provided by any of the above aspects equally apply to all of the other aspects and vice versa.

The above aspects and examples will become apparent from and be elucidated with reference to the embodiments described hereinafter.

BRIEF DESCRIPTION OF THE DRAWINGS

Exemplary embodiments will be described in the following with reference to the following drawing.

DETAILED DESCRIPTION OF EMBODIMENTS

FIGS. 1-8 relate to a photon counting detector, and detector tiles for a photon counting detector. In an example, there is provided a photon counting detector comprising a plurality of detector tiles. Each detector tile comprises a sensor material layer 20, an integrated circuit 30, an input/output connection or flex 50, a high voltage electrode or foil 60, and an anti scatter grid 10. The input/output connection or flex is connected to the integrated circuit (e.g. Application Specific Integrated Circuit—ASIC). The input/output connection might consist of one or more parts. For example, a rigid or flex interposer may be used to interface the Sensor to the ASIC pixels. A flex can in addition be used to provide power and control signals to the ASIC, while also distributing the digital readout signals to the data management system. Alternatively, the input/output connection or flex 50 can be a single component (e.g. rigid/flex or flex) fulfilling both purposes of pixel interconnection and ASIC control/power/readout). The integrated circuit is configured to readout signals from the sensor material layer. This can be to readout signals from a plurality of pixels of the sensor material layer. The anti scatter grid is positioned adjacent to a surface of the sensor material layer. The high voltage electrode or foil 60 extends across the surface of the sensor material layer and is configured to provide a bias voltage to the surface of the sensor material layer. The high voltage electrode or foil comprises at least one tail section 70. Relating to the photon counting detector and the plurality of detector tiles, the high voltage electrode or foil of a first detector tile is configured to make an electrical connection with the high voltage electrode or foil of an adjacent detector tile via one or more tail sections of the at least one tail section of the first detector tile and/or via one or more tail sections of the at least one tail section of the adjacent detector tile.

It is to be noted that input/output connection or flex can in fact be in the form of a number of parts and have further functions. There can for example be a rigid interposer for the pixel-to-pixel connection, whereas the "flex" can be considered to have the purpose of communication and power for the ASIC to the external "world". However, here the input/output connection or flex can fulfil both purposes.

In an example, the high voltage electrode or foil of each subsequent or adjacent detector tile connects to a high voltage supply via one (or more) tail sections or the ASG itself of the preceding tile.

In an example, a tail section of at least one high voltage electrode or foil is connected directly to a high voltage supply 100 or connected directly to a connection or flex 110 that leads to a high voltage supply.

Thus, for example an end detector tile of the photon counting detector can be connected directly to a voltage supply, and the other detector tiles are provided with the required high voltage in a daisy chain manner via connections to adjacent detector tiles.

According to an example, the high voltage electrode or foil of the first detector tile is configured to make an electrical connection with the high voltage electrode or foil of a second adjacent detector tile via one or more tail sections of the at least one tail section of the first detector tile and/or via one or more tail sections of the at least one tail section of the second adjacent detector tile.

According to an example, the high voltage electrode or foil of the first detector tile is configured to make an electrical connection with the high voltage electrode or foil of a third adjacent detector tile via one or more tail sections of the at least one tail section of the first detector tile and/or via one or more tail sections of the at least one tail section of the third adjacent detector tile.

According to an example, the high voltage electrode or foil of the first detector tile is configured to make an electrical connection with the high voltage electrode or foil of a fourth adjacent detector tile via one or more tail sections of the at least one tail section of the first detector tile and/or via one or more tail sections of the at least one tail section of the fourth adjacent detector tile.

According to an example, one or more tail sections of the at least one tail section of the first detector tile are configured to make an electrical connection with one or more tail sections of the at least one tail section of the adjacent detector tile.

According to an example, for each detector tile the anti scatter grid is not electrically connected to the high voltage electrode or foil.

According to an example, for each detector tile a surface of the high voltage electrode or foil facing away from the sensor material layer comprises an insulating layer.

According to an example, for each detector tile the anti scatter grid is electrically connected to the high voltage electrode or foil. The anti scatter grid of the first detector tile is configured to electrically connect to the anti scatter grid of an adjacent detector tile via the one or more tail sections of the at least one tail section of the first detector tile and/or via the one or more tail sections of the at least one tail section of the adjacent detector tile.

According to an example, tail sections contacting anti scatter grids of adjacent detector tiles extend in a direction away from the sensor material layers. Additionally or alternatively tail sections contacting tail sections of adjacent detector tiles extend in the direction away from the sensor material layers.

According to an example, for each detector tile one or more of the at least one tail section are fixedly attached to one or more respective sides of the anti scatter grid.

According to an example, the photon counting detector comprises at least one high voltage connection or flex 110. Each detector tile of a plurality of detector tiles adjacent to a high voltage connection or flex of the at least one high voltage connection or flex is configured to electrically connect to the high voltage connection or flex by a tail section.

The one or more high voltage connections or flexs 110 can be placed at different positions with respect to detector tiles of the photon counting detector, such as centrally or offset to one side, or at the end of the photon counting detector, or all of these for a number of high voltage connections or flexs.

According to an example, each detector tile has a high voltage electrode or foil comprising one, or two, or three or four tail sections.

According to an example, each detector tile is configured to be removed from the photon counting detector.

In an example a photon counting detector is provided comprising a plurality of detector tiles. Each detector tile comprises: a sensor material layer 20, an integrated circuit 30, an input/output connection or flex 50, a high voltage electrode or foil 60, and an anti scatter grid 10. The input/output connection or flex is connected to the integrated circuit. The integrated circuit is configured to readout signals from the sensor material layer. This can be from a plurality of pixels of the sensor material layer. The anti scatter grid is positioned adjacent to a surface of the sensor material layer. The high voltage electrode or foil extends across the surface of the sensor material layer and is configured to provide a bias voltage to the surface of the sensor material layer. The high voltage electrode or foil comprises at least one tail section 70. Relating to the photon counting detector and the plurality of detector tiles, the high voltage electrode or foil of a first detector tile is configured to make an electrical connection with a high voltage supply 80 via one or more tail sections of the at least one tail section of the first detector tile and/or via one or more tail sections of at least one tail section of an adjacent detector tile.

In an example, there is provided a detector tile for a photon counting detector comprising a plurality of detector tiles. The detector tile comprises a sensor material layer 20, an integrated circuit 30, an input/output connection or flex 50, a high voltage electrode or foil 60, and an anti scatter grid 10. The input/output connection or flex is connected to the integrated circuit. The integrated circuit is configured to readout signals from the sensor material layer. This can be from a plurality of pixels of the sensor material layer. The anti scatter grid is positioned adjacent to a surface of the sensor material layer. The high voltage electrode or foil extends across the surface of the sensor material layer and is configured to provide a bias voltage to the surface of the sensor material layer. The high voltage electrode or foil comprises at least one tail section 70.

According to an example, when connected into the photon counting detector the high voltage electrode or foil of the detector tile is configured to make an electrical connection with a high voltage electrode or foil of an adjacent detector tile via one or more tail sections of the at least one tail section of the detector tile and/or via one or more tail sections of at least one tail section of the adjacent detector tile.

In an example, when connected into the photon counting detector the high voltage electrode or foil of the detector tile is configured to make an electrical connection with a high voltage electrode or foil of a second adjacent detector tile via one or more tail sections of the at least one tail section of the detector tile and/or via one or more tail sections of at least one tail section of the second adjacent detector tile.

In an example, when connected into the photon counting detector the high voltage electrode or foil of the detector tile is configured to make an electrical connection with a high voltage electrode or foil of a third adjacent detector tile via one or more tail sections of the at least one tail section of the detector tile and/or via one or more tail sections of at least one tail section of the third adjacent detector tile.

In an example, when connected into the photon counting detector the high voltage electrode or foil of the detector tile is configured to make an electrical connection with a high voltage electrode or foil of a fourth adjacent detector tile via one or more tail sections of the at least one tail section of the detector tile and/or via one or more tail sections of at least one tail section of the fourth adjacent detector tile.

In an example, when connected into the photon counting detector one or more tail sections of the at least one tail section of the detector tile are configured to make an electrical connection with one or more tail sections of the at least one tail section of the adjacent detector tile.

In an example, the anti scatter grid is not electrically connected to the high voltage electrode or foil.

In an example, a surface of the high voltage electrode or foil facing away from the sensor material layer comprises an insulating layer.

In an example, the anti scatter grid is electrically connected to the high voltage electrode or foil, and wherein when connected into the photon counting detector the anti scatter grid of the detector tile is configured to electrically connect to the anti scatter grid of an adjacent detector tile via the one or more tail sections of the at least one tail section of the detector tile and/or via the one or more tail sections of the at least one tail section of the adjacent detector tile.

In an example, when connected into the photon counting detector one or more tail sections in contact with anti scatter grids of adjacent detector tile extend in a direction away from the sensor material layer, and/or wherein one or more tail sections in contact with tail sections of adjacent detector tiles extend in the direction away from the sensor material layer.

In an example, one or more of the at least one tail section are fixedly attached to respective sides of the anti scatter grid.

In an example, the high voltage electrode or foil comprises one, or two, or three or four tail sections.

In an example, the detector tile is configured to be inserted into and removed from the photon counting detector.

Continuing with the figures, these show detector tiles that can be formed into a photon counting detector. Each detector tile is composed of a number of elements in a stack. A detector tile has an anti-scatter grid (ASG) 10, a direct-conversion sensor material layer 20, and an interposer, also referred to as an input/output connection or flex. The detector tile also has a photon counting ASIC 30 and a mechanical base 40. The ASG is a pixelated arrangement of X-ray attenuating walls that absorb the majority of X-ray photon not impinging along the normal (perpendicular) direction of the direct conversion material (e.g. CZT, CdTe, Si, GaAs, Ge, Se, Perovskites . . . ). An ASG pixel comprises one or more CZT equivalent pixels. The CZT material layer at its top surface has a top common electrode (cathode). The HV potential needs to be brought to this top side of the CZT. Typically, a kapton or polyamide foil with an electrically conducting plane makes contact with the CZT cathode, with this provision of HV potential here being termed as being provided by a HV electrode or foil 60. Since it hardly carries any current (a few µA), the HV foil is very thin and covers the full area of the CZT (homogeneous X-ray absorption). A number of pixelated electrodes (anodes) are also provided at the bottom side of the CZT material layer. The pixel is defined by the geometrical arrangement of anodes at the bottom side and the electric field resulting from biasing the detector to a high voltage (negative HV on cathode) with respect to the anode (near ground). X-ray interactions within the CZT bulk generate electron-hole pairs (cloud) which are separated by the electric field. Electrons drift towards the anode inducing a charge signal for the pixel (3D volume) where the interaction occurred. The ASIC captures the signal and internally produces a pulse height voltage, the amplitude of which is proportional to the charge (energy) of the incident photon. A set of energy discriminators within the ASIC allows classifying the number of photons of a determined energy. In a first embodiment, each ASG pixel comprises an equivalent CZT pixel. Other arrangements are not restricted, e.g. 1- to- 2×2. The CZT pixels are connected to the same number of ASIC channels by means of an interposer. An interposer may not be strictly necessary and the ASIC (particularly if equipped with through silicon vias) may have direct contact (1:1) to the CZT. The interposer acts as redistribution layer (if required) to bridge a possible gap in pixel pitch between the CZT and the ASIC. ASIC power supply and digital readout are routed through an input/output connection or flex 50 that can also be termed a flex cable. This can be considered as part of the interposer assembly. The routing is provided to a second level interconnect (data management system). The ASIC is attached to a mechanical base 40 for stability, cooling and mechanical fixture to the data management system and gantry. The above does not restrict other arrangements. For example, the ASG could be a 1D arrangement (slits) which might be suited for CT scanner with limited coverage. Due to stringent alignment requirements and serviceability, it is preferred that each detector tile has its own ASG, and the new HV distribution technique described here is compatible with complete Tile assemblies where each detector tile includes its own ASG.

Figure 1:
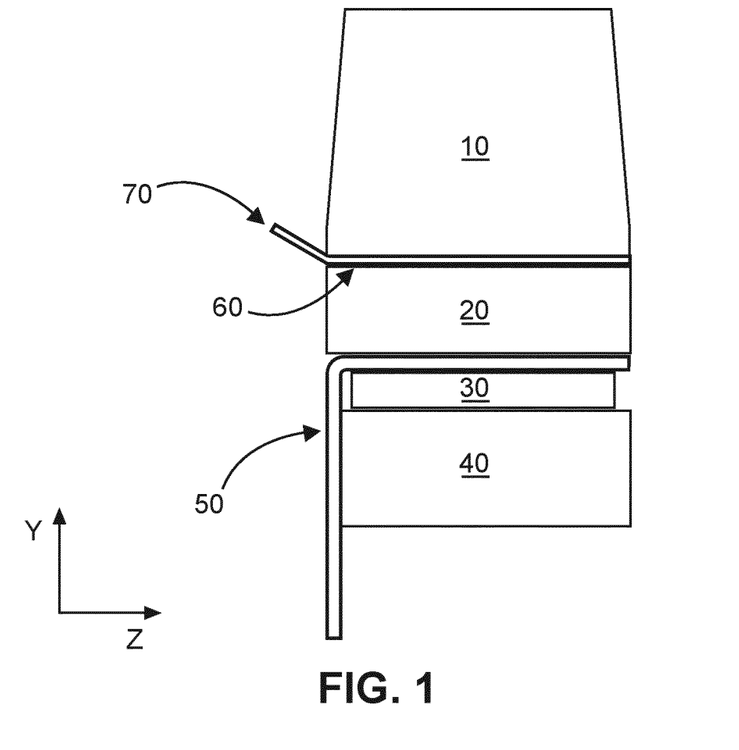
FIG. 1 shows an example of an assembly stack of a tile detector, including a High voltage (HV) foil extension for daisy-chain connection.

FIG. 1 shows an assembly stack of a Tile detector, including a HV foil 60 having an extension or tail section 70 useable for "daisy-chain" HV bias connection. The HV electrode or foil has a tail 70 that extends in one direction (preferably in z). That is, the HV foil electrode or foil 60 is larger than the area of the CZT sensor, where the HV electrode or foil 60 has a tail section 70. This is shown in the simplified sketch (not including an interposer) of FIG. 1. The HV foil 60 with the extension or tail 70 contains also the metal plane carrying the HV potential. It is assumed that the HV foil is flexible and can easily be bent. The extension or tail 70 can be across the full width of the Tile, or just a small "finger" like limb, as shown in more detail in FIG. 6. The structure of FIG. 1 assumes that both HV tail 70 and I/O connection or flex 50 are coming out of the detector Tile along the z dimension. This is only for illustrative purposes. In reality, the preferred orientation of the I/O connection flex 50 is to escape the Tile along the y axis. However, the I/O flex and tail section or sections can be aligned in different orientations as required.

Figure 2:
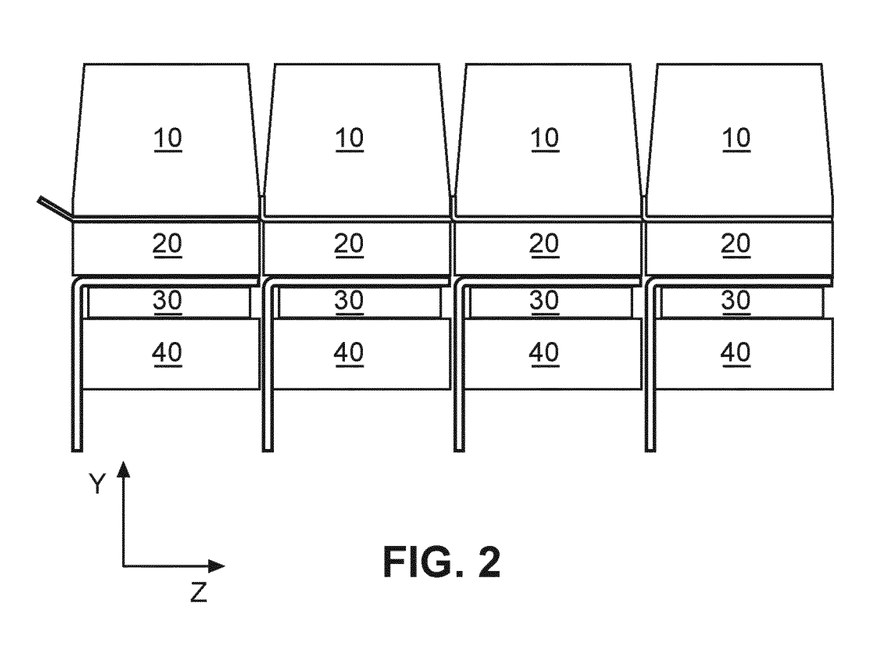
FIG. 2 shows an example of interconnection of the HV foil across adjacent tile detectors in one dimension.

FIG. 2 shows the interconnection of the HV electrode or foil 60 across a number of detector tiles, here along the z direction. Thus, due to the detector tiles being placed adjacent to each other with the sensor material layers 20, such as CZT, aligned the HV tail section 70 of a detector tile is forced to make pressure contact with the preceding detector tile. In this specific embodiment the ASG 10 is in electrical contact with the HV electrode or foil 60 underneath. The HV tail section 70 of the adjacent tile only requires to make contact with the ASG 10 of the preceding detector tile. FIG. 2 shows an example of a 4 cm equivalent iso-center coverage (assuming 1 cm coverage per Tile), however clearly other sizes and coverages are possible. As for FIG. 1, in FIG. 2 the I/O connection or flex 50 for each tile are depicted in the z axis, just for illustrative purposes, and could for example be in another direction.

Figure 3:
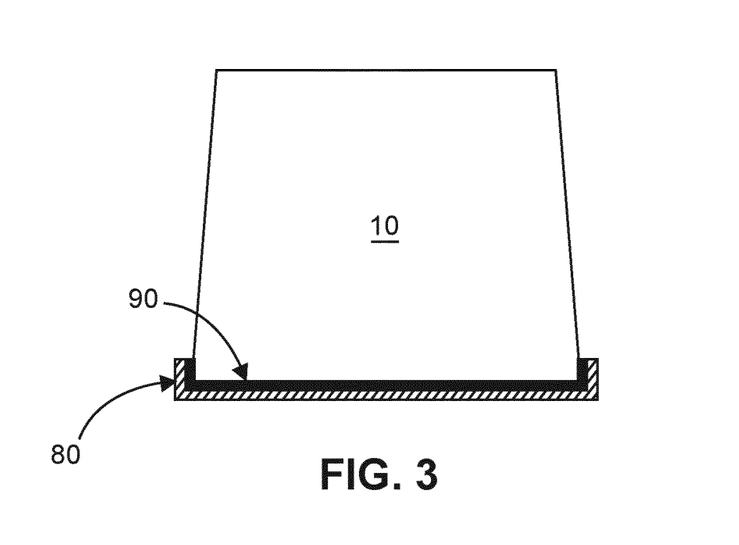
FIG. 3 shows an example of an isolated anti scatter grid (ASG) of a tile detector.

FIG. 3 shows an example of an isolated anti scatter grid (ASG) of a tile detector. As discussed for FIG. 2 the ASG could be electrically connected to the HV. Normally, servicing photon counting detectors requires the disconnection of the HV to ensure the safety of the service personal, and as such having the ASG connected to HV does not necessarily pose an immediate risk. However, there can be situations where the ASG being electrically isolated from the HV finds utility, and this is shown in FIG. 3 where the ASG is isolated while still allowing the daisy-chain distribution of the HV bias. Thus, as shown in FIG. 3 a detector tile has an ASG with a partial wrap at its base. Thus, the high voltage electrode or foil 60 and its tail sections 70, where in FIG. 3 there are two tail sections at either end of the high-voltage electrical foil 60, is in the form of a conductive layer 80 with an isolation layer 90 between the conductive layer and the ASG 10. That is, a conductive layer acts as the daisy-chain connection of the HV potential while being not in contact with the ASG. It is worth nothing that such layers can basically be a single polyimide layer with a metal plane deposition on one side.

Figure 4:
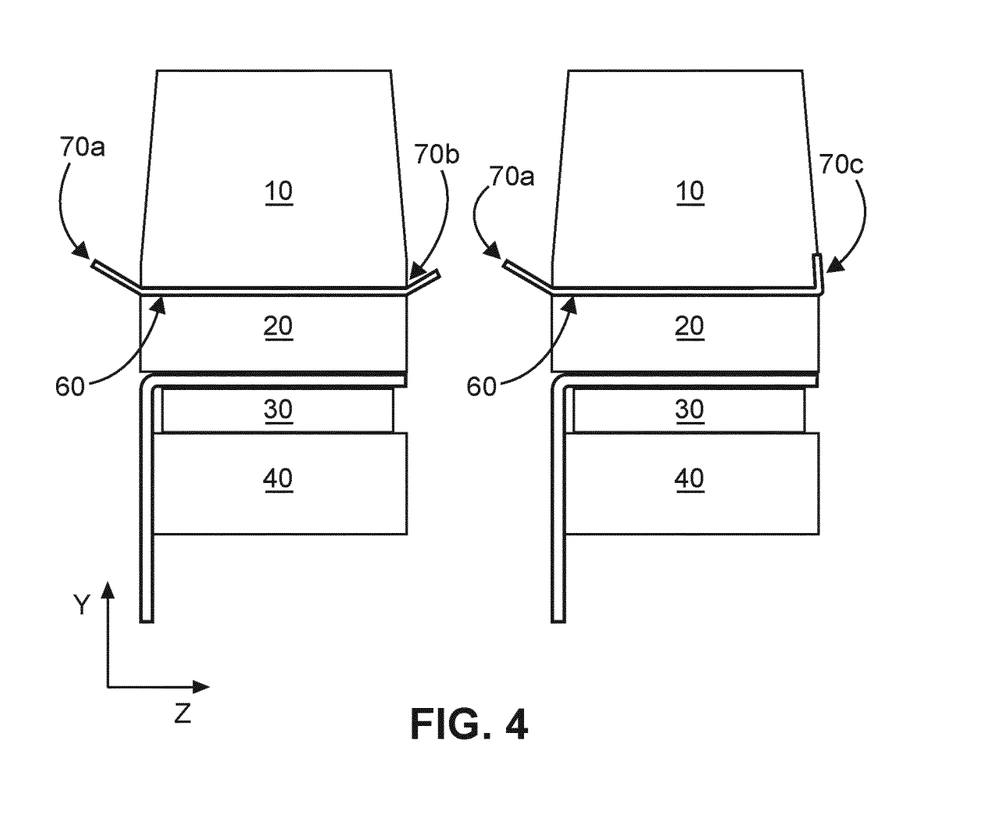
FIG. 4 shows an example of a detector tile including two HV tails for propagation of the HV potential.

FIG. 4 shows an example of a detector tile including two HV tails 70 for propagation of the HV potential. The HV electrode or foil 60 has extensions or tail sections 70a and 70b on both sides of the Tile (along Z). One tail section 70a of is used in the same manner as described with respect to FIGS. 1-2. The second tail section 70b is however lifted and glued to the side of the ASG 10. The HV electrode or foil 60 is in this case fully isolated on its top side, i.e. ASG is not exposed to HV. By lifting the second tail and gluing to one side of the ASG, the metal plane is exposed and accessible to the adjacent Tile. FIG. 4 shows in one image such a further extension or tail section of the HV foil and the position of the $2^{nd}$ HV tail section after the assembly has been finalized. It is to be noted that the HV electrode or foil 60 does not need to be isolated on its top side, in which case the ASG will be exposed to HV.

Figure 5:
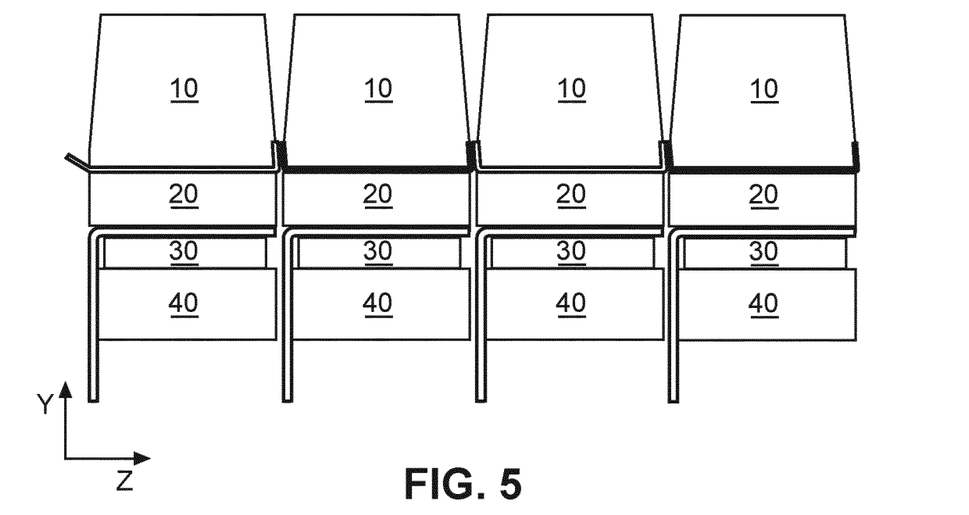
FIG. 5 shows an example of four detector tiles with HV bias potential propagating from one detector tile to the next via HV tails.

FIG. 5 shows an example of four detector tiles with HV bias potential propagating from one detector tile to the next via HV tail sections 70. The module assembly and HV contact is clearly shown. The HV electrodes or foils 60 with associated tail sections 70 are the same, but in FIG. 5 are drawn differently in order to make the arrangement easier to visualize.

The above embodiments are based on pressure contact to propagate the HV potential. The HV tail sections 70, whether on one side or more than one side of the detector tile, can be equipped with metal springs to actually make contact. In this way, the whole structure can better accommodate small movements required for proper alignment of each tile without losing HV contact. Alternatively, the HV contact can utilize conducting foam (and/or combined with polyamide foils) which can be compressed allowing to accommodate assembly tolerances.

In the above embodiments, and particularly those shown in FIG. 2 and FIG. 5, only one "daisy-chain" connection is shown. This implies that if the first detector tile (designated as the left most detector rile in this case) needs to be replaced, all detector tiles will need to be removed first. However, in a further embodiment the daisy chain is split along the middle. That is, two daisy chain connections (tail sections 70 of the high voltage electrode or foil 60) exist, one from either side of the module along z. In this case, in a worst case service repair situation, only the at fault detector tile will need to be dismounted. Other configurations are possible.

It is to be noted that all embodiments described above prevent having to bring the HV connection through the sides of the detector tile, which mitigates a detrimental impact on the performance of the sensor due to a distortion of the electric filed on the sides when the HV connection is via the sides of the detector tile.

Figure 6:
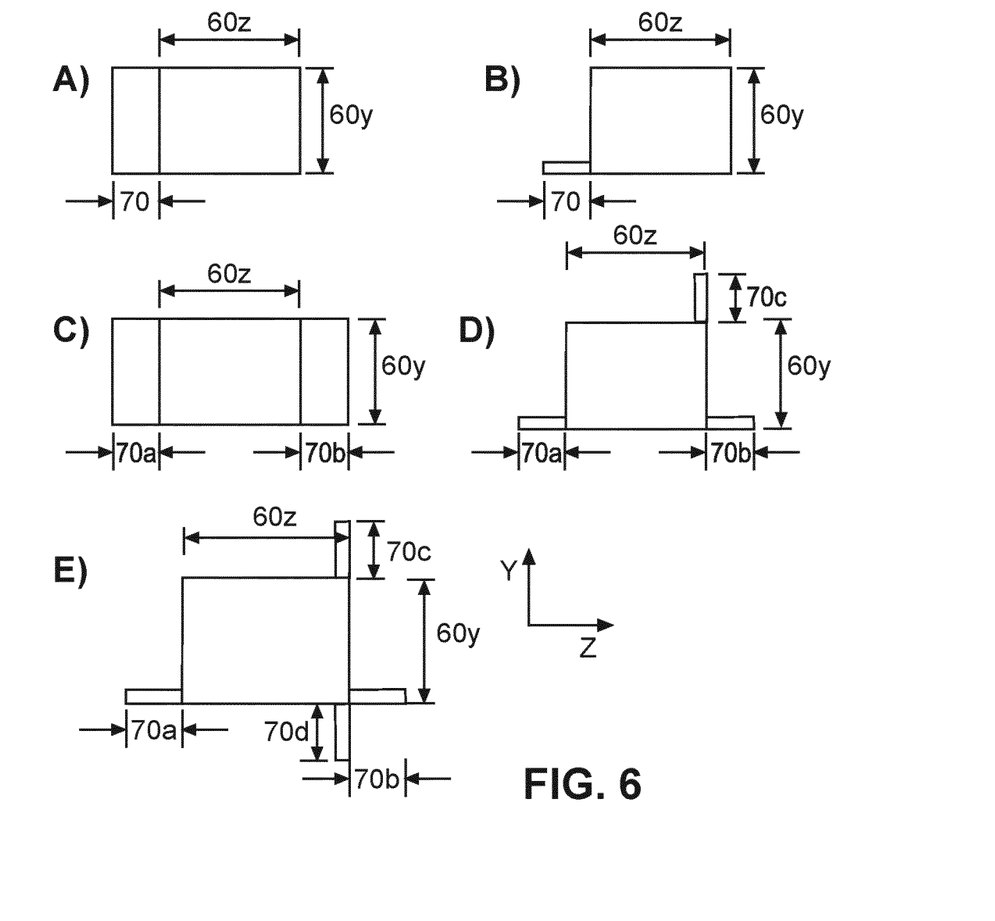
FIG. 6 shows examples of HV foils and HV tails as seen from the top, where no ASG is shown and the sensor material layer such as CZT, ASIC, input/output connection and base are not shown and would be concealed below.

As mentioned above, the HV tail sections (s) 70 can have different forms. FIG. 6 shows a few examples seen from the top (no ASG shown for clarity). The high voltage electrode foil 60 is shown extending in the y axis (60y) and in the y axis (60z) for all figures. A) and B) are versions that are compatible with the embodiments shown in FIG. 2. In A) there is a single HV tail section 70 that extends across the high voltage electrode or foil 60, whilst in B) the HV tail section is in the form of a finger. The version shown at C) is compatible with the embodiment shown in FIG. 4 and FIG. 5. In this case there are two tail sections 70a and 70b and the HV takes the full width of the Tile (along y). It could however have one or more smaller tail sections as for the case represented in B). Case D) shows a combination of C), with HV tail sections in the form of fingers, with tail sections 70a and 70b at opposite sides of the detector tile and a third HV tail section 70c orientated perpendicularly. This provides the ability to extend tiles in two dimensions. For example, it is possible to further propagate the HV across detector tiles in y, either within a module (which may consist for example of two lines of detector tiles along z) or across modules. Although not preferable, it is theoretically possible to bring the HV connection to one single Tile and let the HV propagate across the whole detector. FIG. 6 E) then shows a further example which is particularly suited to distribute the HV potential across detector tiles within a modules, whilst also offering redundancy. Here, tail sections 70a and 70b extend from opposite sides of the detector tile in one axial direction and tail sections 70c and 70d extend from opposite sides of the detector tile in the orthogonal axial direction. Thus, if one of the HV does not have proper contact, there is still 3 point-redundancy provided.

Figure 7:
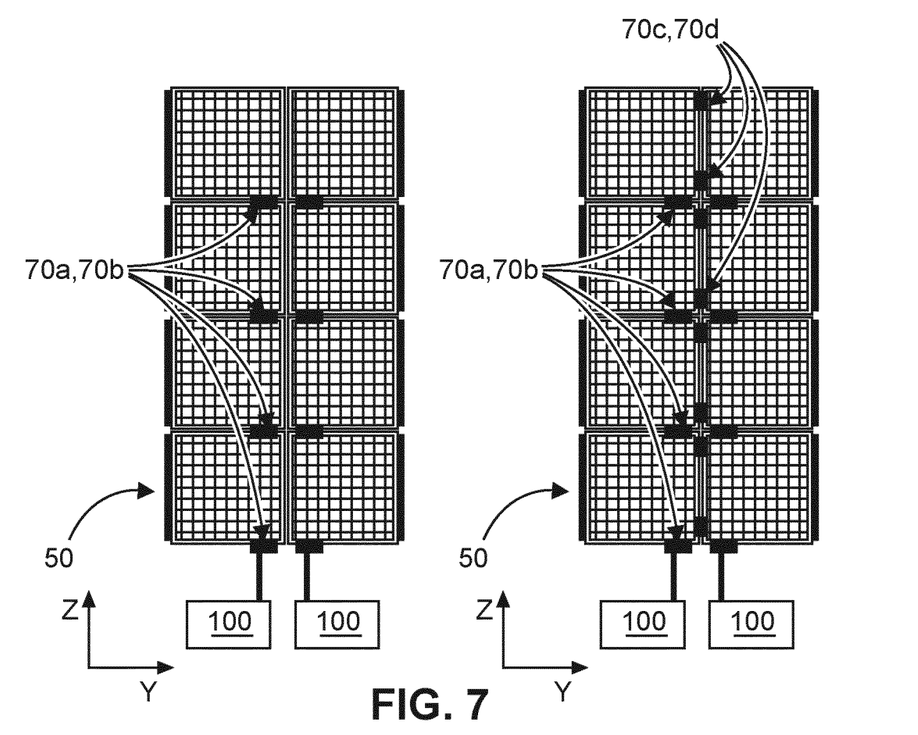
FIG. 7 shows examples of different HV distribution within a module composed of two lines of four detector tiles.

FIG. 7 shows two potential module configurations. In this case (seen from top), the I/O connection or flex 50 escapes along y and the HV tail sections 70a, 70b are oriented along z, as it is preferred in a practical implementation. For these examples, it is assumed that each module is composed of 2 lines of Tiles along z. These show the case of having 2 HV supplies 100 (or one with two connections). The HV is propagated from detector tile to detector tile along z using a HV electrode or foil to with tail sections shown for example that that shown in the left hand example of FIG. 7), albeit with narrower HV tail sections 70a and 70b than those shown in C) of FIG. 6. The module shown in FIG. 7 uses a HV electrode or foil 60 with tail sections 70a, 70b, 70c, and 70d in a similar fashion as depicted in D) of FIG. 6. In this case an initial detector tile receives the HV potential and this is distributed further across tiles along both z, and y direction. In this case a higher level of redundancy is achieved with respect to failure of a single connection via a single HV tail section. It is also to be noted that in the right hand example of FIG. 7 only one power supply is required, with two shown for redundancy reasons.

Figure 8:
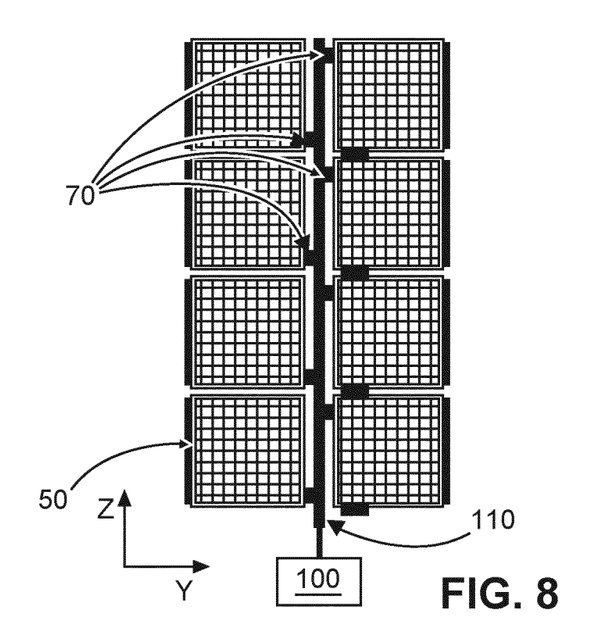
FIG. 8 shows an example of HV distribution with a double-sided HV tree contacting the HV Tails from each Tile

FIG. 8 shows yet another embodiment where a single double sided flex 110 is placed in between both rows of tiles along z. In this case the HV electrode or foil 60 for the left hand 4 detector tiles has a tail section 70 as shown for example in FIG. 6B, whilst for the right hand 4 detector tiles a level of redundancy is provides and the HV electrode or foil 60 has tail sections 70a, 70b, and 70c as shown in FIG. 6D and indeed tail section 70b can be omitted. Here though, one HV tail section 70 for each detector tile goes to one side and makes contact to the additional flex component 110 that is coupled to the HV supply 100.

It is to be noted that in all embodiments above, the HV electrode or foil 60 where it extends over the sensor material layer 20 of the detector tile does not need to cover the full area of the detector tile. It could be patterned for alignment purposes, and it could be made of a plurality of materials, and it could be partially transparent, etc.

It has to be noted that embodiments of the invention are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. A single processor or other unit may fulfill the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A photon counting detector, comprising:
   a plurality of detector tiles, wherein each detector tile comprises:
      a sensor material layer;
      an integrated circuit;
      an input/output connection or flex;
      a high voltage electrode or foil; and
      an anti-scatter grid;
      wherein, the input/output connection or flex is connected to the integrated circuit;
   wherein, the integrated circuit is configured to readout signals from the sensor material layer;
   wherein, the anti: scatter grid is positioned adjacent to a surface of the sensor material layer;

wherein, the high voltage electrode or foil extends across the surface of the sensor material layer and is configured to provide a bias voltage to the surface of the sensor material layer, and wherein the high voltage electrode or foil comprises at least one tail section; and wherein, the high voltage electrode or foil of a first detector tile is configured to make an electrical connection with the high voltage electrode or foil of an adjacent detector tile via one or more tail sections of the at least one tail section of the first detector tile and/or via one or more tail sections of the at least one tail section of the adjacent detector tile.

2. The photon counting detector according to claim 1, wherein the high voltage electrode or foil of the first detector tile is configured to make an electrical connection with the high voltage electrode or foil of a second adjacent detector tile via one or more tail sections of the at least one tail section of the first detector tile and/or via one or more tail sections of the at least one tail section of the second adjacent detector tile.

3. The photon counting detector according to claim 2, wherein, the high voltage electrode or foil of the first detector tile is configured to make an electrical connection with the high voltage electrode or foil of a third adjacent detector tile via one or more tail sections of the at least one tail section of the first detector tile and/or via one or more tail sections of the at least one tail section of the third adjacent detector tile.

4. The photon counting detector according to claim 3, wherein, the high voltage electrode or foil of the first detector tile is configured to make an electrical connection with the high voltage electrode or foil of a fourth adjacent detector tile via one or more tail sections of the at least one tail section of the first detector tile and/or via one or more tail sections of the at least one tail section of the fourth adjacent detector tile.

5. The photon counting detector according to claim 1, wherein one or more tail sections of the at least one tail section of the first detector tile are configured to make an electrical connection with one or more tail sections of the at least one tail section of the adjacent detector tile.

6. The photon counting detector according to claim 1, wherein for each detector tile the anti scatter grid is not electrically connected to the high voltage electrode or foil.

7. The photon counting detector according to claim 6, wherein for each detector tile a surface of the high voltage electrode or foil facing away from the sensor material layer comprises an insulating layer.

8. The photon counting detector according to claim 1, wherein for each detector tile the anti scatter grid is electrically connected to the high voltage electrode or foil, and wherein the anti scatter grid of the first detector tile is configured to electrically connect to the anti scatter grid of an adjacent detector tile via the one or more tail sections of the at least one tail section of the first detector tile and/or via the one or more tail sections of the at least one tail section of the adjacent detector tile.

9. The photon counting detector according to claim 1, wherein tail sections contacting anti scatter grids of adjacent detector tiles extend in a direction away from the sensor material layers, and/or wherein tail sections contacting tail sections of adjacent detector tiles extend in the direction away from the sensor material layers.

10. The photon counting detector according to claim 1, wherein for each detector tile one or more of the at least one tail section are fixedly attached to one or more respective sides of the anti scatter grid.

11. The photon counting detector according to claim 1, wherein the photon counting detector comprises at least one high voltage connection or flex, and wherein each detector tile of a plurality of detector tiles adjacent to a high voltage connection or flex of the at least one high voltage connection or flex is configured to electrically connect to the high voltage connection or flex by a tail section.

12. The photon counting detector according to claim 1, wherein each detector tile has a high voltage electrode or foil comprising one, two, three, or four tail sections.

13. The photon counting detector according to claim 1, wherein each detector tile is configured to be removed from the photon counting detector.

14. A detector tile for a photon counting detector comprising a plurality of detector tiles, wherein the detector tile comprises:
- a sensor material layer;
- an integrated circuit;
- an input/output connection or flex;
- a high voltage electrode or foil; and
- an anti: scatter grid;
- wherein, the input/output connection or flex is connected to the integrated circuit;
- wherein, the integrated circuit is configured to readout signals from the sensor material layer;
- wherein, the anti scatter grid is positioned adjacent to a surface of the sensor material layer; and
- wherein, the high voltage electrode or foil extends across the surface of the sensor material layer and is configured to provide a bias voltage to the surface of the sensor material layer, and wherein the high voltage electrode or foil comprises at least one tail section.

15. The detector tile according to claim 14, wherein when connected into the photon counting detector the high voltage electrode or foil of the detector tile is configured to make an electrical connection with a high voltage electrode or foil of an adjacent detector tile via one or more tail sections of the at least one tail section of the detector tile and/or via one or more tail sections of at least one tail section of the adjacent detector tile.

* * * * *